United States Patent [19]

Stikvoort

[11] 4,143,387

[45] Mar. 6, 1979

[54] SIGNAL MIXER INCLUDING RESISTIVE AND NORMAL GATE FIELD-EFFECT TRANSISTOR

[75] Inventor: Eduard F. Stikvoort, Eindhoven, Netherlands

[73] Assignee: U.S. Philips Corporation, New York, N.Y.

[21] Appl. No.: 804,576

[22] Filed: Jun. 8, 1977

[30] Foreign Application Priority Data

Jun. 16, 1976 [NL] Netherlands ............... 7606483

[51] Int. Cl.² ........................................... H01L 29/78
[52] U.S. Cl. ........................................ 357/23; 357/41;
357/51; 357/59; 307/220 C; 328/15; 328/16;
328/159
[58] Field of Search .................. 357/23, 51, 59, 41;
328/15, 16, 159; 307/220

[56] References Cited

U.S. PATENT DOCUMENTS

| 3,090,923 | 5/1963 | Wolff | 328/159 |
|---|---|---|---|
| 3,700,976 | 10/1972 | Dill | 357/23 |
| 3,714,522 | 1/1973 | Komiya et al. | 357/23 |
| 3,719,864 | 3/1973 | Taniguchi et al. | 357/23 |
| 3,728,695 | 4/1973 | Frohman-Bentchkowsky | 357/23 |
| 3,745,425 | 7/1973 | Beale et al. | 357/23 |
| 3,999,210 | 12/1976 | Yamada | 357/23 |
| 4,001,860 | 1/1977 | Cauge et al. | 357/23 |
| 4,058,771 | 11/1977 | Ohsawa et al. | 328/15 |

OTHER PUBLICATIONS

C. Hu et al., "A Resistive-Gated IGFET Tetrode," IEEE Trans, on Elec. Dev., vol. ED-18, #7, Jul. 1971, pp. 418-425.

Primary Examiner—Joseph E. Clawson, Jr.
Attorney, Agent, or Firm—Thomas A. Briody; Jack E. Haken

[57] ABSTRACT

A mixer comprises a MOS transistor having an ideal quadratic characteristic. The transistor is of the D-MOST type and comprises a resistive gate across which a voltage drop is applied transversely to the longitudinal direction of the channel. The adjustment point of the transistor is chosen to be so that the range of the gate voltages between the threshold voltage and the voltage at which the slope reaches the saturation value is always situated during operation within the voltage drop across the gate electrode. The signals to be mixed are introduced capacitively via a second gate electrode situated above the resistive gate electrode and capacitively coupled therewith.

18 Claims, 14 Drawing Figures

SIGNAL MIXER INCLUDING RESISTIVE AND NORMAL GATE FIELD-EFFECT TRANSISTOR

The invention relates to a device for mixing two electrical signals by means of an insulated gate field effect transistor comprising a semiconductor body having surface-adjoining source and drain regions of one conductivity type which are separated from each other by an intermediate region of the second conductivity type having therein a surface-adjoining channel region above which is situated the gate electrode insulated from the semiconductor body by an insulating layer, means being present with the aid of which the signals to be mixed can be introduced and means to derive an output signal. The invention also relates to a semiconductor device having an insulated gate field effect transistor, in particular but not exclusively suitable to mix two signals.

The mixing of signals is an operation which is generally known and used in electronics and which is carried out inter alia for frequency conversion. The principle of mixing is based on the multiplication of the signals by a non-linear characteristic. By introducing the signals to be mixed as input signals in a circuit having a non-linear characteristic which comprises at least a quadratic term, an output signal is obtained which as a result of the quadratic term comprises inter alia the first harmonics of the signals, a component having the sum of the frequencies of the input signals, and a component having the difference of the frequencies of the input signals. In accordance with the specific use, the desired component can be selected.

Field effect transistors of the conventional type show an approximately quadratic relationship between the saturation current $I_d$ through the transistor and the voltage $V_g$ at the gate electrode, which means that the slope or transconductance, defined as $$G_m = \left(\frac{\delta I_d}{\delta V_g}\right)$$

at constant drain voltage depends approximately linearly on the gate voltage. In such conventional transistors the source and drain regions are formed by zones of the first conductivity type diffused or implanted at a distance from each other in a body of the second conductivity type. Due to the approximately linear relationship between the slope and the gate voltage, such transistors may be used for mixing (multiplying) signals, for example by additively applying the two signals in the form of input voltages to the gate electrode and deriving the output signal from the drain electrode.

Since the output characteristic of a conventional field effect transistor is generally not entirely quadratic, undesired side products often occur in the output signal. Said side products generally have to be filtered out of the output signal. Although this is no drawback in many applications. In other cases, however, when the non-linear deformation must be very small (for example, in the case of frequency conversion of wide band signals) a conventional field effect transistor is unsuitable.

Conventional field effect transistors of the type described above show the additional drawback of being comparatively inert as compared, for example, to bipolar transistors and can usually or not be used for high frequency applications, for example, for frequencies between 500 MHz and 1 GHz.

Field effect transistors in which the channel region is so short — in the order of 1 μm — that they even show gain in the said frequency range are known. Such transistors are usually of the type which in literature is referred to as D-MOST (double diffused MOST) or DSA-MOST (diffused self-aligned). The indications of these types of field effect transistors relate to their method of manufacture. Transistors of this type are described inter alia in the article "D-MOS Transistor for Microwave Applications" by H. J. Sigg et al. and published in I.E.E.E. Transactions on electron Devices, vol. ED-19, No. 1, Janauary 1972. As described in this article, D-MOST's have a slope $G_m$ which has an approximately linear variation within a given range of gate electrode voltages. As stated in said article, said transistors might be used for mixing signals within said voltage range. However, as with field effect transistors of the conventional type, transistors of the D-MOST type show the drawback that for many applications the variation of the slope, as a function of the gate voltage, is insufficiently linear so that too much deformation and/or undesired components occur in the output signal.

One of the objects of the invention is to provide a device of the kind described by means of which two signals can be mixed without undesired deformations and/or undesired mixed products in the output signal.

A further object of the invention is to provide a mixing device which may be used for high frequency applications.

A further object of the invention is to provide a field effect transistor which is suitable for use in such a mixing device and which, at least within a given range of voltages, shows a substantially linearly varying slope $G_m$ as a function of the input voltage.

The invention is inter alia based on the recognition that a transistor having a substantially linear slope (within a given voltage range) can be obtained, starting from a transistor having a substantially constant slope within said voltage range, by structuring the gate electrode so that the width of the active channel region varies linearly with input voltage. The active channel region is to be understood to mean herein that part of the channel region through which electric current flows at the given voltages. The width of the channel region is to be understood to mean herein the size of the active channel region parallel to the surface and transverse to the direction of current.

A device for mixing two electrical signals according to the invention is characterized in that the gate electrode of the field effect transistor comprises a conductive layer which is insulated from the surface by an insulating layer and is hereinafter referred to as lowermost gate electrode, and which is provided with connection means for applying a voltage drop across the lowermost gate electrode in a direction substantially parallel to the surface and substantially transverse to the main direction of current in the channel region of the transistor, and that the transistor, in the absence of a voltage drop, belongs to the type of insulated gate field effect transistors which has a slope, $G_m$, which does not vary with gate electrode voltage at least within a given range of voltages applied to the gate electrodes.

As a result of the voltage drop across the gate electrode the operating point may be chosen to be so that the gate electrode comprises a part whose potential lies beyond the threshold voltage of the transistor — below which part a conductive channel is present in the channel region — and a part whose potential is such, relative to the threshold voltage, that no current conduction is possible in the channel region below this part. By uniformly varying the potential of the gate electrode by supplying an input signal — while maintaining the voltage drop — a linear modulation of the width of the active part of the channel region is obtained. As will be described in greater detail with reference to the accompanying description of the figures, the device thus shows a slope which also increases linearly with the input signal voltage and is thus excellently suitable for mixing signals.

It has been found that a device having favorable properties in this respect can be obtained when the length of the channel region, between the source and drain region and measured in a direction parallel to the main current direction in the channel region, is at most 2 μm and is preferably equal to or smaller than 1.5 μm.

In order to prevent punch-through between the source and drain regions of the transistor with these very short channel regions the doping concentration of at least the part of the drain region of one conductivity type which adjoins the intermediate region of the second conductivity type between the source and drain region is chosen to be lower than the concentration of impurities in the intermediate region, so that the depletion region of the p-n junction between the intermediate region and the drain region, which is reversely biased during operation, extends mainly in the drain region rather than in the intermediate region.

The transistor is preferably of the D-MOST type in which the said intermediate region and the source zone have been obtained by diffusion and/or ion implantation of impurities of opposite types through at least partly the same windows in a masking layer. As already known, such a transistor has a slope $G_m$ which increases with increasing gate voltages, in a given range of voltages, from substantially zero to a saturation value, and then remains substantially constant. As will become apparent from the description of the figures, with such a transistor it is possible to nevertheless obtain a slope which varies as a linear function of the voltage drop, in spite of the fact that the local potential of the gate electrode lies within the range of voltages in which the slope is not constant. For that purpose a voltage drop is advantageously applied across the lowermost gate electrode which is larger than the range of voltages within which — in the absence of a voltage drop across the gate electrode — the slope of the transistor varies from zero to the said substantially constant value.

As a result of the very short channel length, the transistors of the present invention have very favourable high-frequency properties so that mixing devices according to the present invention are excellently suitable for use in high-frequency ranges, for example, in the frequency range up to 1 GHz. In order to restrict the dissipation as a result of the applied voltage drop, the lowermost gate electrode is preferably manufactured from a suitable resistance material, for example doped polycrystalline silicon. Advantageously, one or both signals to be mixed can be applied to said resistive layer. Preferably, however, the resistive layer forming the lowermost gate electrode is covered by an insulating layer on which a second comparatively low-ohmic conductive layer, hereinafter termed uppermost gate electrode, is provided. By applying at least one of the signals to said readily conductive layer — which is connected capacitively to the resistive layer — it is possible to maintain the high-frequency properties of the transistor even though the gate electrode comprises a resistive layer having comparatively large RC time constant.

According to the invention, a semiconductor device having an insulated gate field effect transistor which is particularly suitable to mix signals, is characterized in that the gate electrode comprises two sub layers which are situated one above the other, namely a lowermost gate electrode which is separated from the channel region by a first insulating layer covering the surface of the body and an uppermost gate electrode which is separated from the channel region by a second insulating layer covering the lowermost gate electrode and the first insulating layer. The lowermost gate electrode comprises connection means to apply a voltage drop across the lowermost gate electrode in a direction substantially parallel to the surface and substantially transverse to the main direction of current in the channel region of the transistor. The transistor, in the absence of a voltage drop across the lowermost gate electrode, belongs to the type of insulated gate electrode transistors which has a substantially constant slope within a certain range of voltages applied to the insulated gate electrode.

The invention will now be described in greater detail with reference to a few embodiments and the accompanying diagrammatic drawing, in which.

It is to be noted that the figures are diagrammatic and are not drawn to scale.

Figure 1:
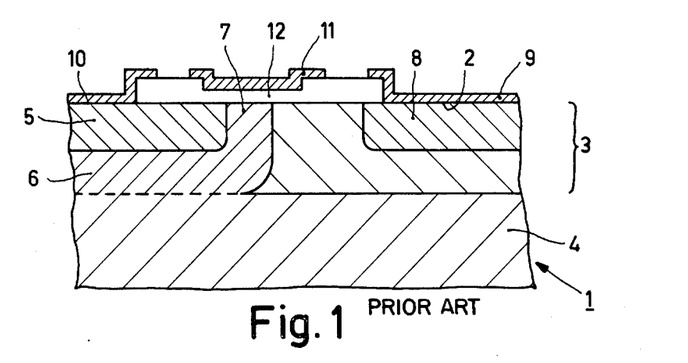
FIG. 1 is a cross-sectional view of a known D-MOS transistor.
Figure 2:
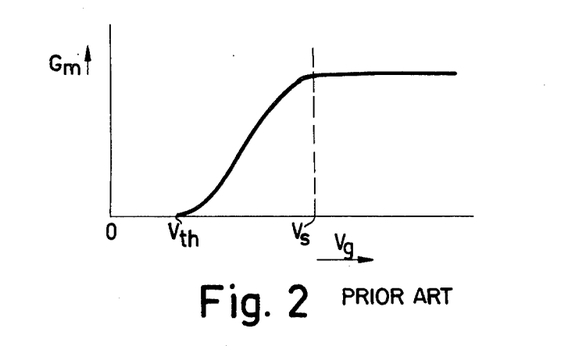
FIG. 2 shows the slope $G_m$ of the transistor shown in FIG. 1 as a function of the gate voltage $V_g$

FIG. 1 is a sectional view of a known field effect transistor of a type which is often referred to as D-MOST or DSA-MOST. FIG. 2 shows the slope $G_m$ of said transistor as a function of the gate voltage $V_g$.

The conventional D-MOST comprises a semiconductor body 1 having a region 3 of one conductivity type which adjoins the surface 2 and is bounded on the lower side by a part of the body 4, hereinafter termed the substrate, of the second conductivity type. Assuming, by way of example, the transistor to be of the n-channel type, the surface region 3 which itself is the drain region of the transistor is formed by n-type semiconductor material, while the part 4 is p-type semiconductor material. The region 3 may be obtained, for example, by providing an n-type epitaxial layer on the p-type substrate 4 or, starting from the substrate 4, by converting a surface part into n-type material by means of ion implantation.

The source region of the transistor is formed by the n-type surface zone 5. Source and drain regions are separated from each other by an intermediate p-type region 6 in which the channel region 7 of the transistor is situated. The source region 5 and the intermediate region 6 may be obtained by diffusion of n-type and p-type impurities, respectively, into the n-type region 3 via the same diffusion window in a masking layer provided on the surface 2. Instead of by diffusion, the impurities may of course also be provided in the body 1 by means of ion implantation. Simultaneously with the provision of the source region 5, the n-type surface zone 8 is also provided which has a higher concentration than the region 3 and forms a contact zone for the drain electrode 9. The source region 5 has a contact 10. The gate electrode 11 is provided above the channel region 7 and is separated from the surface 2 of the body 1 by a thin insulating layer 12. As shown in the figure, the intermediate region 6 has diffused through the expitaxial layer 3 down to the substrate so that a suitable reference potential, for example earth potential, can be applied to the intermediate region via the substrate.

It is assumed by way of example that the transistor is of the enhancement type, that is that in the absence of a voltage at the gate electrode the transistor is not conductive. Between zero voltage and a threshold voltage $V_{th}$, the slope $$G_m = (\frac{\delta I_d}{\delta V_g})$$

(with constant voltage between the source and drain region) will be substantially zero as is shown in FIG. 2. From the threshold voltage the slope increases with increasing gate voltage $V_g$. The relationship between the slope and the gate voltage is approximately linear in this range, as with normal insulated gate field effect transistors. However, the deviations from the linearity are generally so large that, for a number of applications, multiplication of two signals by means of such a transistor is not possible because the non-linear deviations of the characteristic of $G_m$ cause too many undesired mixing signals in the output signal.

When $V_g$ increases further, the slope reaches a saturation value $V_s$ and does not substantially increase. A possible cause of this behaviour of the slope as a function of the gate voltage $V_g$ can be found in the length of the channel 7 of the transistor. Said length is determined by the difference in diffusion depths of the zones 5 and 6 and can thus be very short and be, for example, on the order of 1 μm. The depletion region, formed during operation, near the p-n junction between the drain region 3 and the intermediate region 6 will extend mainly in the lower-doped drain region 3 and not in the intermediate region 5, so that suitable voltages can be applied to the drain region 3, 8 without punch-through occurring from the drain region to the source region in spite of the short channel length between the source region 5 and the drain region 3,8.

Figure 3:
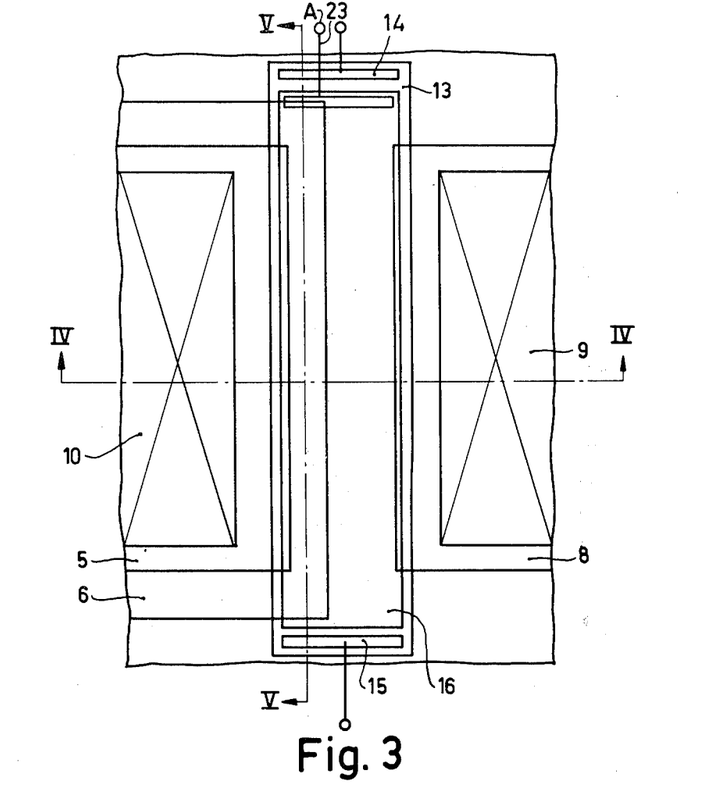
FIG. 3 is a plan view of a field effect transistor suitable for use in a mixing device according to the invention.
Figure 4:
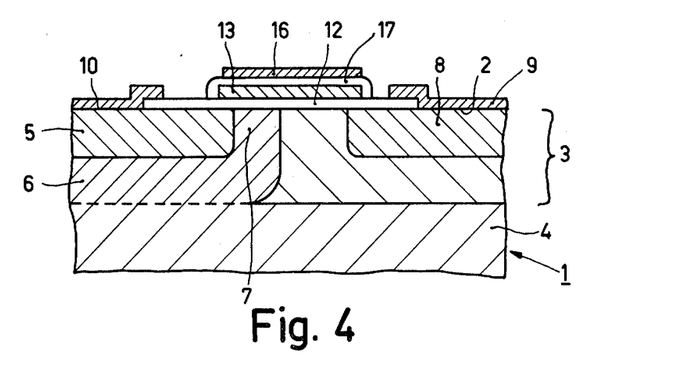
FIG. 4 is a sectional view taken on the line IV—IV of the transistor shown in FIG. 3.
Figure 5:
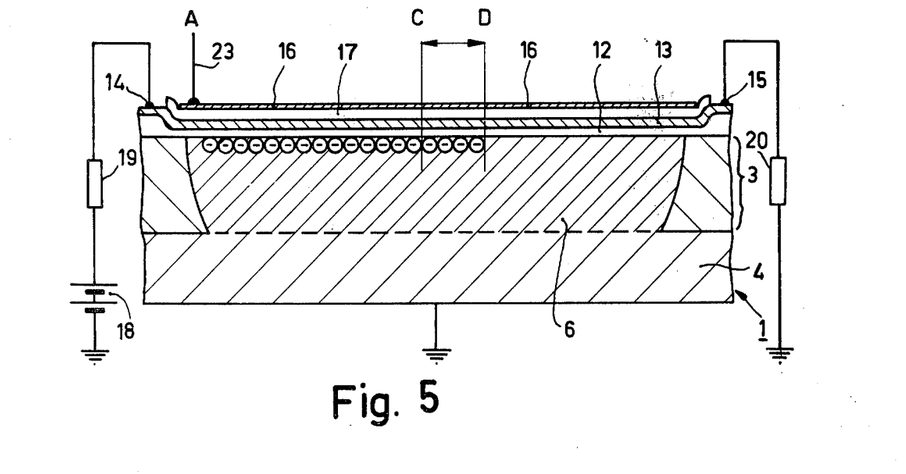
FIG. 5 is a sectional view taken on the line V—V of the transistor shown in FIG. 3.

By giving the gate electrode in the above-described transistor a configuration which differs from the normal shape, a field effect transistor structure can be obtained in which the drain current and gate voltage show a substantially pure quadratic relationship without higher order terms (at least within a given range of gate voltages). FIG. 3 is a plan view of a field effect transistor of the D-MOST type having such a gate electrode configuration. FIG. 4 is a cross-sectional view of said transistor corresponding to the sectional view of a conventional D-MOST shown in FIG. 1. FIG. 5 is a cross-sectional view of the transistor in a direction transverse to the current direction in the transistor. For simplicity, in the present example, the same reference numerals are used for corresponding components as for the transistor shown in FIG. 1. The transistor shown in FIGS. 3, 4 and 5 differs mainly from the transistor described with reference to FIG. 1 in that the gate electrode comprises a conductive layer 13, hereinafter termed lowermost gate electrode, which is separated from the body 1 by the insulating layer 12 and which comprises connection means 14, 15 which are provided at either end of the gate electrode 13. By means of said connection means, a voltage drop can be applied across the lowermost gate electrode 13 substantially parallel to the surface of the body and substantially transversely to the main current direction in the channel region 7 of the transistor. Since in the absence of a voltage drop across the gate electrode 13 the transistor belongs to the type of field effect transistors which, at least within a certain range of voltages to be applied to the gate electrodes, have a substantially constant slope, a substantially quadratic relationship between the current through the transistor and the gate voltage can be obtained by applying a suitable voltage difference between the connection means. This will be described in greater detail with reference to FIGS. 5 and 6. It is to be noted that a second gate electrode, hereinafter referred to by uppermost gate electrode 16, is provided above the gate electrode 13 and is separated from the lowermost gate electrode 13 by an intermediate insulating layer 17. The meaning of the uppermost gate electrode will be explained hereinafter because said electrode is not essential for obtaining the quadratic $I_d$ - $V_g$ characteristic.

Figure 6:
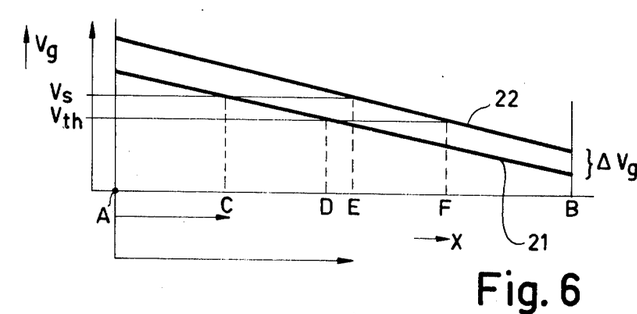
FIG. 6 shows the potential variation across the gate electrode of the transistor shown in FIGS. 3 and 4 as a function of position on the gate.

As shown in FIG. 5, a voltage drop is applied across the gate electrode 13 by means of the voltage source 18 of which the positive terminal is connected to the connection contact 14 via the resistor 19; the negative terminal is connected to the connection contact 15 via the resistor 20 and, like the substrate 4, is set up at a reference potential, for example earth. As will be described hereinafter, the resistors 19 and 20 serve to obtain a high impedance between the gate electrode 13 and earth. FIG. 6 shows the variation of the potential $V_g$ of the gate electrode 13 as a function of the coordinate x, x being the distance from points on the gate electrode to the connection contact 14 measured in a direction parallel to the voltage drop across the gate electrode. Point A in FIG. 6 hence corresponds to the connection contact 14 and point B corresponds to the connection contact 15. Furthermore shown in the figures are the voltages $V_s$ and $V_{th}$ which correspond to the saturation voltage $V_s$ and the threshold voltage $V_{th}$ of FIG. 2.

Line 21 denotes the potential variation across the gate electrode 13 at a first voltage. As shown in the figure, there may be distinguished between three regions on the gate electrode: a first region AC having a potential which is higher than the saturation value $V_s$; this region provides a contribution to the total slope $G_m$ which mainly depends linearly only on the size of said region. Adjacent the region AC is a region CD of which the potential is between the saturation voltage $V_s$ and the threshold voltage $V_{th}$. The third region DB of the gate electrode 13 wherein the potential is below the threshold voltage $V_{th}$. Hence no current can flow below said part of the gate electrode. The transistor may be considered to be constructed from a number of parallel transistors each having an associated slope $G_m(x)$. When $G_m^x(x)$ is the slope per unit length, then the overall slope $G_m$ of the transistor may be calculated from $$G_m = \int_A^B G_m^*(x)dx = \int_A^C G_m^*(x)dx + \int_C^D G_m^*(x)dx + \int_D^B G_m^*(x)dx. \quad (1)$$

Because the slope is constant in the region AC ($=G_m^x(0)$) and is equal to zero in the region DB, equation (1) may be written as $$G_m = G_m^*(0) \cdot AC + \int_C^D G_m^*(x)dx. \quad (2)$$

Line 22 denotes the potential variation across the gate electrode 13 at a voltage which is $\Delta V_g$ higher than line 21. In an analogous manner, the slope becomes:

$$G_m = G_m^*(0) AE + \int_E^F G_m^*(x)dx, \quad (3)$$

where E and F denote the points of the gate electrodes where the potential has the values $V_s$ and $V_{th}$, respectively. When the difference VA−VB is equal for both curves 21, 22, then it holds that $$\int_C^D G_m^*(x)dx = \int_E^F G_m^*(x)dx;$$

which means that the voltage range within which the slope varies (see FIG. 2) does move along the gate electrode but the contribution of this range to the overall slope of the transistor does not vary. The variation $\Delta G_m$ as a result of the voltage variation $\Delta V_g$ therefore is:

$$\Delta G_m = G_m^x(0) (AE - AC). \quad (4)$$

On a geometrical basis it may be seen that the difference $AE - AC = CE$ is linearly dependent on $\Delta V_g$, so that formula (4) may be written as $$\Delta G_m = G_m^x(0) \cdot \Delta V_g,$$

where P is a constant. Therefore, when a voltage drop VA − VB is chosen larger than the range of voltages $(V_g - V_{th})$ within which — in the absence of a voltage drop — the slope varies from zero to the said constant value, then the transistor can be set to an operating point whereat, within a given range of input voltages $V_g$, the slope (considered within said range) varies linearly with $V_g$, that is $G_m \alpha V_g$.

The drain current $i_d$ resulting from the input signal $V_g$ then is substantially quadratically dependent on the input signal $V_g$, so that the transistor of the type described here is suitable to multiply two signals by each other.

For a low energy dissipation in the gate electrode 13 a considerable resistance is desired between the connection contacts 14 and 15. Therefore, the gate electrode 13 is preferably manufactured from a suitable resistance material, for example polycrystalline silicon deposited on the oxide layer 12, whose resistance can be controlled within wide limits by doping the material with an impurity by methods known in semiconductor technology.

The gate electrode 13 may advantageously be provided with means for the direct supply of electrical signals to the gate electrode in a conventional manner, in particular low-frequency signals. For higher-frequency signals, however, the RC time constant of the resistive gate electrode may form a limitation. In order to be able to use the high-frequency properties inherent in the usual D-MOST's, in spite of the high resistance of the layer 13, the lowermost gate electrode is covered with an insulating layer 17 on which a second conductive layer 16, hereinafter termed the uppermost gate electrode, is situated. In contrast with the lowermost gate electrode, the uppermost gate electrode preferably consists of a readily conducting material, for example aluminium.

Via the connection contact 23 shown diagrammatically in FIG. 5, an electrical signal can be applied to the gate electrode 16. At the given frequency of this signal, the resistors 19 and 20 may be chosen so that the impedance for said signal at the electrode 16 via the electrode 13 and the resistors 19, 20 is much larger than via electrode 13 and the semiconductor body 1 to earth. As a result of this, the signal can be applied capacitively to the electrode 13 via electrode 16. For capacitive coupling which is as strong as possible between the electrodes 13 and 16, the dielectric layer 17 is preferably made as thin as possible. In a more specific embodiment the layer 17 consists of silicon oxide which has been obtained by partly oxidizing the polycrystalline silicon layer 13, the thickness of the layer 17 being approximately 0.1 μm, that is, approximately equal to the thickness of the oxide layer 12 between the gate electrode 13 and the semiconductor body 1.

Figure 7:
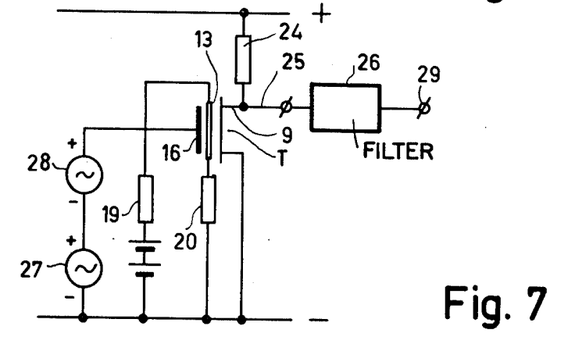
FIG. 7 shows a circuit arrangement of a mixing device according to the invention.

FIG. 7 shows the field effect transistor structure of FIGS. 3 to 5 in a circuit arrangement which may be used as a frequency converter. The drain electrode 9 of the transistor T is connected, via a load resistor 24, to the positive terminal of a supply source. The source electrode is connected to the negative terminal (usually earth) of the supply source. The output signal supplied by the transistor can be derived, via the output terminal 25, from the drain electrode of the transistor and be applied, for example, to a filter 26 by means of which non-desired components can be filtered out. The signal $S_1$ the frequency of which is to be converted, for example, from a low frequency $f_1$ into a higher frequency ($f_1 + f_0$) is supplied by the signal source 27 which is shown diagrammatically. The second signal $S_2$ by which the low-frequency signal is to be converted, is supplied, for example, by the local oscillator 28 the output signal of which has a frequency $f_0$.

The signals $f_1$ and $f_0$ are supplied additively to the gate electrode 16 and applied to the gate electrode 13 by the capacitive coupling between the electrodes 16 and 13.

The output signal appearing at the terminal 25 generally comprises mainly only components of the original frequencies $f_0$ and $f_1$, the first harmonics thereof and the components resulting from the multiplication terms and having frequencies $(f_0 + f_1)$ and $(f_0 - f_1)$, respectively. By means of the filter 26 the desired component can be selected therefrom and derived at the output terminal 29 for further processing. As a result of the substantially quadratic relationship between the drain current $I_d$ in the transistor and the input voltage at the gate electrode 13 and/or 16, in which terms higher than the second order terms are substantially lacking, additional frequency components substantially do not occur or occur in a substantially negligibly small manner at the output terminal 25, so that the device as such can advantageously be used, for example, as a frequency converter for wide-band signals.

Figure 8:
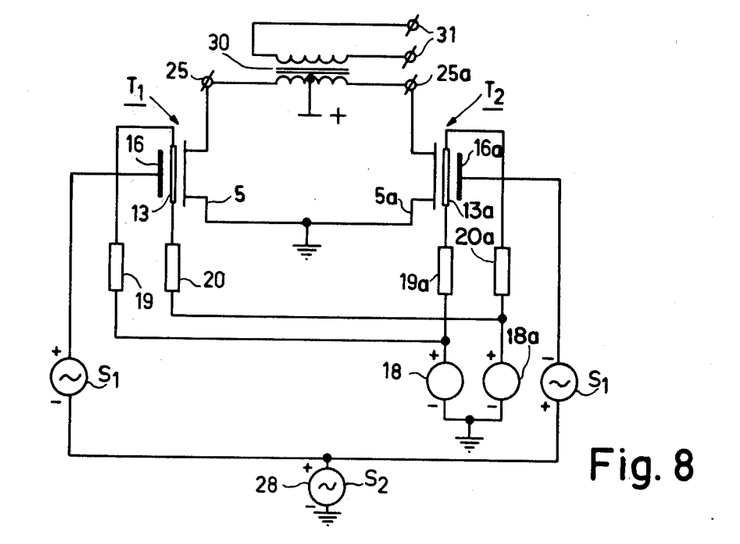
FIG. 8 shows a circuit arrangement of a further mixing device according to the invention.

FIG. 8 shows a circuit diagram of a frequency converter/multiplier/mixer by means of which the first harmonics in the output signal can be eliminated without an extra filter. Instead of a single transistor, the device now comprises two substantially identical transistors of the D-MOST type each having a resistive gate electrode 13 and 13a as well as an aluminium gate electrode 16 and 16a. The source regions 5 and 5a are connected together electrically, while the drain regions are connected to terminals 25 and 25a between which the output signal is derived in a differential manner. Via the resistors 19/20 and 19a/20a, the resistive gate electrodes 13 and 13a are each connected to a voltage source for applying a voltage drop between the connection terminals at the gate electrodes 13. The signals $S_1$ and $S_2$ to be mixed are both introduced via the gate electrodes 16 and 16a in such manner that the high-frequency signal $S_2$ of the local oscillator 28 is applied in phase to the gate electrodes 16 of $T_1$ and $T_2$, while the signal $S_1$ to be converted in frequency is introduced in push-pull. Only the components $S_1$ and $S_1$, $S_2$ appear in opposite phases at the output terminals 25; the remaining components at both output terminals have the same phase. By connecting, for example, the output terminals 25 to a pushpull transformer 30 as indicated in FIG. 8, an output signal can be derived from the output terminals 31 which, in addition to the component with the input frequency $f_1$ only comprises the multiplication term and thus the components $(f_0 + f_1)$ and $(f_0 - f_1)$.

For the circuit arrangement shown in FIG. 8, discrete transistors, that is transistors provided in separate semiconductor bodies, may be used. Preferably, however, the transistors $T_1$ and $T_2$, possibly together with the resistors are incorporated in a common semiconductor body to form a monolithic integrated circuit. During the manufacture the transistors may be subjected to the same process steps and hence will exhibit substantially identical properties. The plan view and cross-sectional view of FIGS. 9 and 10, respectively, show such an integrated semiconductor device. In these figures, the same reference numerals are used as in FIGS. 3 and 4 for corresponding components. The device comprises a semiconductor body 1 of silicon having an n-type surface region 3. This region adjoins a p-type sub-region 4 of the body on its lower side which will hereinafter be referred to as substrate. The transistors $T_1$ and $T_2$ which are both of the D-MOST type comprise a common source region 5 in the form of an elongate strip-shaped n type surface zone. This zone is embedded in the body 1 within a strip-shaped elongate p-type intermediate region 6 which extends from the surface of the body into the substrate 4. The p-type zone 6 divides the n-type surface region into two parts 32 which are isolated from each other (FIG. 10) and which together with the contact zones 8 form the drain zones of the transistors $T_1$ and $T_2$. The gate electrodes 13, 16 are formed by elongate conductive layers which, as shown in the plan view of FIG. 9, extend on either side of the source region 5 and substantially parallel to the longitudinal direction of the source region above the intermediate region 6.

Figure 9:
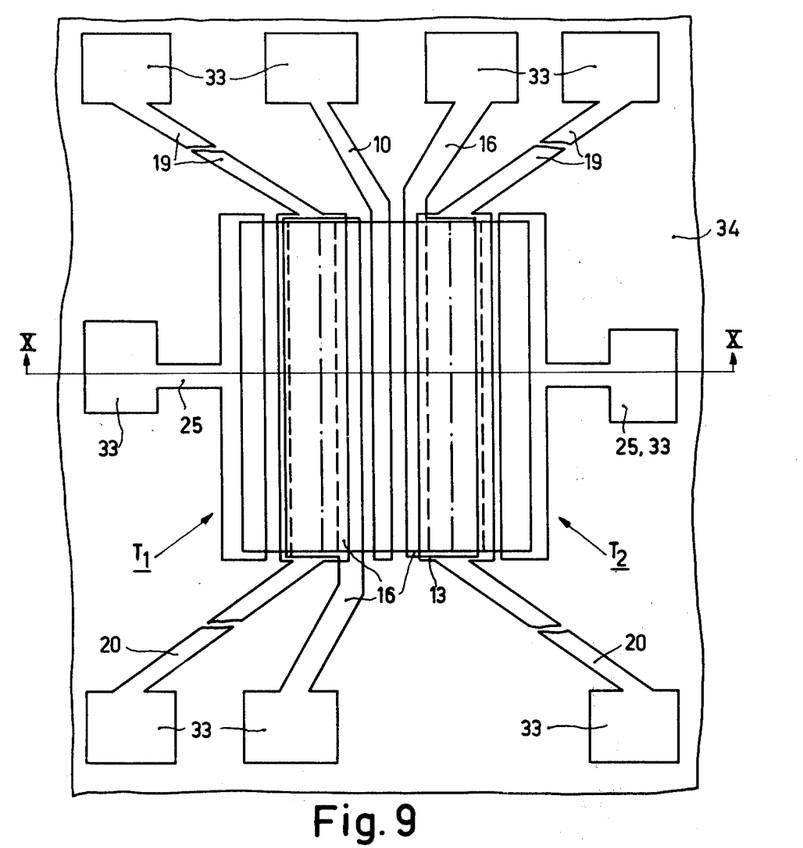
FIG. 9 is a plan view of a part of the semiconductor device suitable for use in the device shown in FIG. 8.
Figure 10:
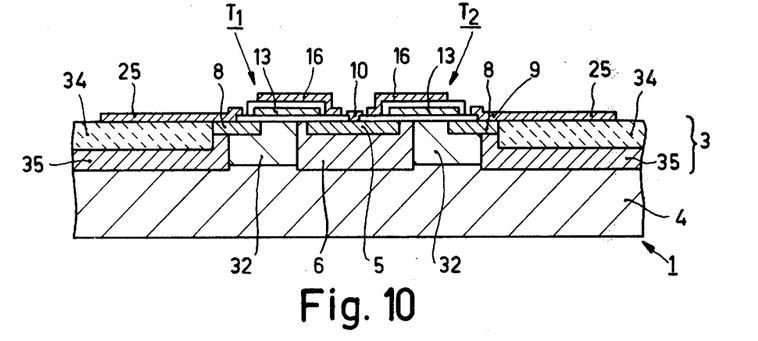
FIG. 10 is a sectional view taken on the line X—X of the device shown in FIG. 9, FIG. 11–FIG. 14 are sectional views of a part of a semiconductor device suitable for use in the device shown in FIG. 8 during a few stages during the manufacture.

It is to be noted that in FIG. 9 the p-type region 6 is shown in dot-and-dash lines, while the n-type contact zones 8 of the drain regions are shown in broken lines. The insulating layers above the transistors $T_1$ and $T_2$, as well as the contact holes in said insulating layers, are not shown for clarity. The connection contacts as shown in FIG. 9, comprise contact pads 33 for the connection of external supply conductors. Between the contact pads 33 associated with to the resistive gate electrodes 13 and said resistive gate electrodes, strips of the same resistance material as of the gate electrodes 13 extend across the semiconductor body 1 and form the resistors 19 and 20 which are also shown in FIG. 8. Of course, resistors diffused or implanted in the semiconductor body may also be used.

The transistors $T_1$ and $T_2$ are situated in an island-shaped part of the semiconductor body 1 which is bounded on its lower side by the substrate 4 and on its upright sides by an island insulation region 34, 35 which is formed partly by a pattern 34 of silicon oxide sunk into the body 1 and a p-type zone 35 extending between the oxide 34 and the substrate. For clarity the zone 35 is not shown in FIG. 9. It will be obvious that, in addition to the island shown in the figure, the body 1 may comprise further islands having further circuit elements.

The manufacture of a more specific embodiment of the device shown in FIG. 9 will now be described, by way of example, with reference to FIGS. 11 to 14. The figures show the device in a sectional view taken on the line X—X of FIG. 9.

Figure 11:
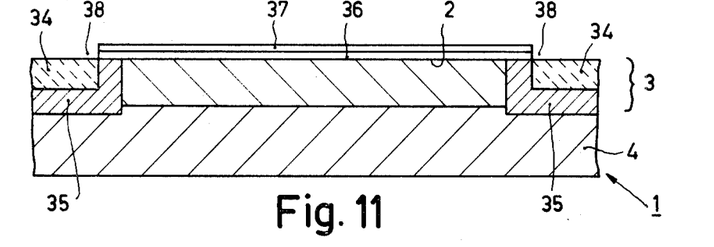
Figure 12:
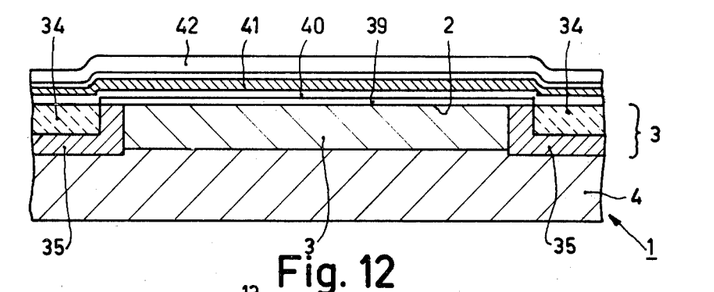

Starting material is a p-type silicon substrate 4, having a thickness of approximately 250 $\mu$m, and a resistivity between 5 and 100 Ohm.cm. The substrate 4 is provided with the n-type surface region 3 by means of ion implantation or by epitaxy, the resistivity of said region being approximately 10 Ohm.cm and the thickness being 1 to 3 $\mu$m. A masking layer comprising a silicon oxide layer 36 and a layer 37 of silicon nitride deposited thereon is then provided on the surface 2. A window 38 is provided in known manner in the masking layer 36, 37. A p-type doping, for example boron, is introduced into the body 1 via said window, after which the surface 2 is subjected to an oxidation treatment at the area of the aperture 38. The body is masked against oxidation by the masking layer 36, 37, so that an oxide pattern 34 which is sunk in the body 1 is obtained only at the area of the aperture 38. The boron atoms provided before the oxidation treatment diffuse further into the body during the oxidation and form the p-type zone 35 below the oxide. The zone 35 may form a channel stopping zone. In particular when the region 3 has been obtained by epitaxial deposition of n-type silicon on the p-type substrate, the zone 35 may be used as an island insulation. The thickness of the sunken oxide 34 is approximately 2 $\mu$m.

FIG. 11 shows the device in this stage of the manufacture.

The masking layers 36, 37 are then removed, after which a double layer comprising a layer 39 of thermal silicon oxide and a layer 40 of silicon nitride is provided on the surface 2 (FIG. 12) so as to obtain the gate dielectric 12 of the transistors $T_1$ and $T_2$. The thicknesses of the layers 39 and 40 are approximately 700 Å and 400 Å, respectively. A layer 41 of polycrystalline silicon having a thickness of approximately 0.5 μm and a resistance approximately 20–30 Ohm per square is then deposited from the gaseous phase to form the resistive gate electrode 13 and the resistors 19 and 20. To form the dielectric layer 17 between the gate electrodes 13 and 16, a silicon oxide layer 42 is formed by partial oxidation of the polycrystalline layer 41 between the gate electrodes 13 and 16. The thickness of the layer 42 is approximately equal to the thickness of the oxide layer 39 and thus is approximately 400 A. Another silicon nitride layer 42 is then deposited on the silicon oxide layer. The thickness of said layer is chosen so that, after etching the silicon nitride layer 40 — in which also the layer 42 is removed over a part of its thickness — a sublayer having a thickness of approximately 700 A remains of the layer 42.

Figure 13:
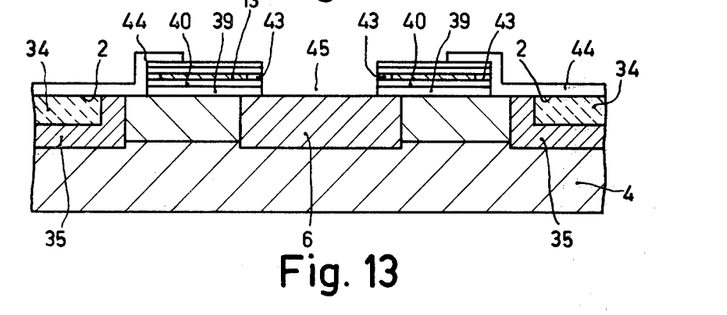
Figure 14:
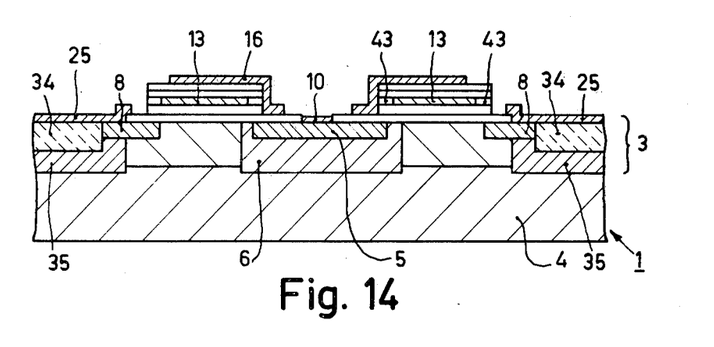

By means of known photolithographic etching processes, the layers 39–42 are removed partly, the nitride layer 40, the polycrystalline layer 41 and the layers 41 and 42 being given the pattern shown in FIG. 9 by the polycrystalline gate electrodes 13 and the resistors 19 and 20. The sides of the resulting gate electrodes 13 and resistors 19, 20 are oxidized so that, as shown in FIG. 13, narrow silicon oxide layers 43 are obtained. The width of the gate electrodes 13 in the present specific embodiment is approximately 5 μm, the length being approximately 200 μm.

As shown in FIG. 13, a layer 44, for example a photo-lacquer layer masking against ion implantation, is then provided on the surface 2 of the body at the area of the drain regions of the transistors $T_1$ and $T_2$. The provision of said layer requires no critical alignment step.

In a self-registering manner, the p-type region 6 may be provided via the window 45 by means of ion implantation techniques, the gate electrodes 13 with the associated oxide and nitride layers together with the photo-lacquer layer 44 and the sunken oxide pattern 34 forming a mask.

The energy with which the ions are implanted in the body 1 may be chosen to be so that a p-type region 6 is formed which extends from the surface 2 down to the substrate 4. After implantation and removal of the photomask 44, a thermal treatment may be carried out so as to remove lattice defects in the semiconductor body as a result of the ion implantation. It is alternatively possible to provide the ions only in a rather narrow surface region close to the surface 2.

After providing the impurity atoms (boron) the photolacquer layer mask 44 may be removed again, after which the body 1 is subjected to a thermal treatment as a result of which the implanted boron ions diffuse further into the body 1 and form the p-type zone 6 adjoining the substrate 4.

The n-type source region 5 (FIG. 14) is then provided via the same window 45 by means of ion implantation and/or diffusion. The zone 5 extends less deep into the body 1, so that the lateral diffusion over said zone also extends less far below the gate electrode 13 than the p-type region 6. Simultaneously with the region 5 the drain contact regions 8 are provided via a window which is defined by the gate electrodes 13 on one side and the sunken oxide pattern on the other side. During or after providing the zones 5 and 8, the uncovered part of the surface 2 is subjected to an oxidation treatment. Contact holes are etched in the resulting oxide layer in the usual manner, after which the aluminium contacts 10 and 25 for the source and drain regions of the transistors $T_1$ and $T_2$ are provided. Simultaneously therewith the uppermost gate electrodes 16 are provided. As shown in the figures, the gate electrodes 16 are slightly shifted with respect to the gate electrodes 13 so as to obtain a low stray capacitance between the gate electrodes 16 and the drain regions of the transistors.

In specimens which are manufactured in this manner the threshold voltage $V_{th}$ is approximately 1.5 Volts. The voltage $V_s$ at which the slope reaches its saturation value is approximately 3 volts. The range in which the slope is constant extends from 3 volts to approximately 5 volts. The adjustment of the device should be such that, with most positive input signal, the point of the gate electrode 13 (one of the ends of the gate electrode 13) having the highest potential does not exceed said 5 volts, while the potential at the area of the other end then is at most equal to the threshold voltage $V_{th}$ (1.5 volts). In addition, with the most negative input signal, the potential at the area of the said first end of the resistance gate electrode 13 may not become lower than the voltage $V_s$ (3 Volts). Favourable results can be obtained by applying +1 volt at one end and +4 volts at the other end in the absence of an input signal. The amplitude of the input signal may then be approximately 0.5 volt, which is sufficient for mixing of the two signals $S_1$ and $S_2$.

It will be obvious that the invention is not restricted to the examples described but that many variations are possible to those skilled in the art without departing from the scope of this invention. For example, the signals to be mixed may also be introduced in manners differing from those described, for example, by directly connecting the signal sources to the resistive gate electrode or gate electrodes. The signals may alternatively be introduced via the substrate. In this case, the resistive gate electrode(s) may be kept at a constant potential by applying the ends of the gate electrode(s), possibly while omitting the resistors 19 and 20, each to a reference potential via a voltage source, in which, if desired, the uppermost gate electrode(s) 16 may also be omitted. Alternatively, signals may be introduced via the source zone(s) 5.

Furthermore, the device may also be manufactured in manners differing from that described. For example, starting material may be a semiconductor body which is entirely p-type conductive and in which a thin n-type surface layer is provided locally, for example by means of ion implantation, between the drain contact zone 8 and the p-type intermediate region 6.

Finally it is to be noted that the use of a second electrode, hereinbefore termed uppermost gate electrode, which is capacitively connected to the resistive gate electrode may present important advantages not only in the device as described but also generally in other devices having such resistive gate electrodes to which a voltage signal is to be applied.

What is claimed is:

1. A semiconductor device including a first insulated gate field effect transistor and suitable for mixing two signals, comprising a semiconductor body having surface-adjoining source and drain regions of one conductivity type which are separated from each other by an intermediate region of the second conductivity type having therein a surface-adjoining channel region above which a gate electrode, insulated from the semiconductor body by an intermediate insulating layer is situated; wherein as an improvement the gate electrode comprises two sublayers disposed one above the other, namely a lower gate electrode which is separated from the channel region by a first insulating layer covering the surface of the body and an upper gate electrode which is separated from the channel region by a second insulating layer covering the lower gate electrode, by the lower gate electrode and by the first insulating layer and further comprising connection means for applying a voltage drop across the lower gate electrode in a direction substantially parallel to the surface and substantially transverse to the main current direction in the channel region of the transistor and wherein the transistor, in the absence of a voltage drop across the lower gate electrode, is the type of transistor having insulated gate electrodes which, within a given range of gate voltages has a substantially constant transconductance.

2. A semiconductor device as claimed in claim 1, wherein the length of the channel region between the source and drain regions, measured in a direction parallel to the main current direction in the channel region, is at most 2 $\mu$m.

3. A semiconductor device as claimed in claim 2, wherein the transistor is a D-MOST transistor.

4. A semiconductor as claimed in claim 2 wherein the lower gate electrode is a relatively resistive material, and that the upper gate electrode is a relatively electrically conductive material.

5. The device of claim 4 wherein the lower gate electrode is impurity-doped polysilicon and the upper gate electrode is aluminium.

6. A semiconductor device as claimed in claim 1 further comprising a second substantially identical insulated gate field effect transistor disposed in the semiconductor body and having a source region conductively connected to the source region of the first transistor, each of the drain regions of the transistors being each provided with an output terminal.

7. A semiconductor device as claimed in claim 6, wherein the surface region is of one conductivity type and is bounded at least on the lower side by a substrate, of the second conductivity type;

the transistors comprise a common source region in an elongate strip-shaped surface zone of one conductivity type which is surrounded in the semiconductor body by a strip-shaped elongate intermediate region of the second conductivity type which intermediate region extends from the surface to the substrate and divides the surface region of one conductivity type into the parts which are insulated from each other and which form the drain regions of the transistor;

the gate electrodes are strip-shaped elongate conductive layers which, viewed on the surface, extend on either side of the source region and substantially parallel to the longitudinal direction of the source region above the intermediate region.

8. An insulated gate field effect transistor device for mixing two electrical signals comprising:

a semiconductor body;

source and drain regions of a first conductivity type disposed in and adjoining the surface of said body;

an intermediate region of a second conductivity type, separating said source and drain regions and containing a channel region which adjoins the surface of said body;

a lower gate electrode, comprising a layer of conductive material disposed over said channel region;

a first insulating layer disposed between said lower gate electrode and said surface of said body;

an upper gate electrode comprising a layer of conductive material disposed over said lower gate electrode;

a second insulating layer disposed between said upper gate electrode and said lower gate electrode;

means for introducing said electrical signals to said device including means for connecting at least one of said electrical signals to said upper gate electrode;

means for deriving a mixed signal from said device; and means for applying a voltage drop across said lower gate electrode in a direction substantially parallel to said surface and substantially transverse to the main direction of current flow in said channel region;

wherein the insulated gate field effect transistor, in the absence of said voltage drop across said lower gate, has a constant transconductance, within at least a given range of voltages applied to said lower gate electrode.

9. The device of claim 8 comprising transistor structures of the D-MOST type.

10. A device as claimed in claim 8, wherein the length of the channel region between the source and drain regions, measured in a direction parallel to the main current direction in the channel region, is at most 2 $\mu$m.

11. A device as claimed in claim 10, wherein the part of the drain region which adjoins the said intermediate region comprises a lower concentration of doping impurities determining the conductivity type than the said intermediate region.

12. A device as claim in claim 8 wherein the lower gate electrode is a resistive material and the upper gate electrode is an electrically readily conductive material.

13. The device of claim 12 wherein the lower gate electrode is impurity-doped polysilicon and the upper gate electrode is aluminium.

14. A device as claimed in claim 8 wherein the voltage drop applied across the lower gate is larger than the range of voltages wherein, in the absence of a voltage drop across the lower gate electrode, the transconductance of the transistor varies from zero to a constant value.

15. A device as claimed in claim 8 wherein the electrical signal having the higher frequency is connected to the upper gate electrode.

16. A device as claimed in claim 8 further comprising means for summing the electrical signals to be mixed and for connecting said sum to the upper gate electrode.

17. A device as claimed in claim 8 wherein the device comprises two substantially identical field effect transistors having source regions, which are electrically connected and drain regions, each provided with an output terminal for deriving a differential output signal; and means for introducing one the signals to be mixed to each of said field effect transistors in the phase, and for introducing the other signal to said transistors with opposed phases.

18. A device as claimed in claim 8 wherein the device is a frequency converter for converting signals of a comparatively low frequency into signals of comparatively high frequencies by mixing with a signal of a comparatively high frequency.

* * * * *

UNITED STATES PATENT AND TRADEMARK OFFICE
CERTIFICATE OF CORRECTION

PATENT NO. : 4,143,387
DATED : March 6, 1979
INVENTOR(S) : EDUARD F. STIKVOORT

It is certified that error appears in the above-identified patent and that said Letters Patent are hereby corrected as shown below:

Claim 4, line 1, after "semiconductor" insert --device--

Signed and Sealed this

Second Day of October 1979

[SEAL]

Attest:

RUTH C. MASON
Attesting Officer

LUTRELLE F. PARKER
Acting Commissioner of Patents and Trademarks